US012757745B2

(12) United States Patent
Kang et al.

(10) Patent No.: US 12,757,745 B2
(45) Date of Patent: Oct. 6, 2026

(54) SEMICONDUCTOR PACKAGE

(71) Applicant: SAMSUNG ELECTRONICS CO., LTD., Suwon-si (KR)

(72) Inventors: Junghoon Kang, Suwon-si (KR); Seungwan Shin, Suwon-si (KR); Jung Hyun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 387 days.

(21) Appl. No.: 18/596,207

(22) Filed: Mar. 5, 2024

(65) Prior Publication Data

US 2025/0038122 A1 Jan. 30, 2025

(30) Foreign Application Priority Data

Jul. 26, 2023 (KR) ........................ 10-2023-0097126

(51) Int. Cl.

| | |
|---|---|
| ***H10W 46/00*** | (2026.01) |
| ***H10W 70/65*** | (2026.01) |
| ***H10W 74/10*** | (2026.01) |
| ***H10W 74/15*** | (2026.01) |
| ***H10W 90/00*** | (2026.01) |

(52) U.S. Cl.

CPC ........... *H10W 46/00* (2026.01); *H10W 70/65* (2026.01); *H10W 90/00* (2026.01); *H10W 90/401* (2026.01); *H10W 46/301* (2026.01); *H10W 74/10* (2026.01); *H10W 74/15* (2026.01); *H10W 90/724* (2026.01); *H10W 90/734* (2026.01)

(58) Field of Classification Search

CPC ..... H10W 46/00; H10W 70/65; H10W 90/00; H10W 90/401; H10W 46/301; H10W 74/10; H10W 74/15; H10W 90/724; H10W 90/734

See application file for complete search history.

(56) References Cited

U.S. PATENT DOCUMENTS

| | | | |
|---|---|---|---|
| 10,204,889 | B2 | 2/2019 | Lin et al. |
| 10,748,861 | B2 | 8/2020 | Wu et al. |
| 11,107,801 | B2 | 8/2021 | Jeng et al. |
| 11,121,006 | B2 | 9/2021 | Wang et al. |
| 11,380,666 | B2 | 7/2022 | Tsai et al. |
| 11,581,284 | B2 | 2/2023 | Kang et al. |
| 2023/0060618 | A1 | 3/2023 | Lee et al. |

*Primary Examiner* — Jay C Kim
*Assistant Examiner* — Woo K Lee
(74) *Attorney, Agent, or Firm* — Sughrue Mion, PLLC

(57) ABSTRACT

Provided is a semiconductor package including a first redistribution substrate including a first redistribution insulating layer and a first redistribution via, a first insulating layer on the first redistribution substrate, a solder pad on the first insulating layer, a first alignment key penetrating the first insulating layer and extending to an inside of the first redistribution insulating layer, and a solder via spaced apart from the first alignment key and electrically connected to the solder pad, wherein the first alignment key includes a first key body extending from a first surface of the first insulating layer to the inside of the first redistribution substrate, and a first key protrusion protruding from a side surface of the first key body toward the first insulating layer, and wherein the first insulating layer includes a non-photosensitive material.

20 Claims, 11 Drawing Sheets

SEMICONDUCTOR PACKAGE

CROSS-REFERENCE TO RELATED APPLICATION

This application claims priority to Korean Patent Application No. 10-2023-0097126, filed on Jul. 26, 2023, in the Korean Intellectual Property Office, the disclosure of which is incorporated herein in its entirety by reference.

BACKGROUND

Example embodiments of the present disclosure relate to a semiconductor package including an alignment key pattern.

Integrated circuit chips may be provided with a semiconductor package to be suitably applied to circuit boards of electronic products or otherwise combined within an electronic system. In a general semiconductor package, an integrated circuit chip (or a semiconductor chip) may be mounted on a printed circuit board (PCB) and may be electrically connected to the PCB through bonding wires or bumps. With development of the electronic industry, many studies are being conducted to realize a highly reliable, highly integrated and small size semiconductor package.

SUMMARY

One or more embodiments provide a semiconductor package with improved accuracy.

According to an aspect of an embodiment, there is provided a semiconductor package including a first redistribution substrate including a first redistribution insulating layer and a first redistribution via, a first insulating layer on the first redistribution substrate, a solder pad on the first insulating layer, a first alignment key penetrating the first insulating layer and extending to an inside of the first redistribution insulating layer, and a solder via spaced apart from the first alignment key and electrically connected to the solder pad, wherein the first alignment key includes a first key body extending from a first surface of the first insulating layer to the inside of the first redistribution substrate, and a first key protrusion protruding from a side surface of the first key body toward the first insulating layer, and wherein the first insulating layer includes a non-photosensitive material.

According to another aspect of an embodiment, there is provided a semiconductor package including a first redistribution substrate including a first redistribution insulating layer and a first redistribution via, a first insulating layer on the first redistribution substrate, a solder pad on the first insulating layer, a first alignment key penetrating the first insulating layer and extending to an inside of the first redistribution insulating layer, and a solder via spaced apart from the first alignment key and electrically connected to the solder pad, wherein the first alignment key includes a first key body extending from a first surface of the first insulating layer into the inside of the first redistribution substrate, and a first key protrusion protruding from a side surface of the first key body toward the first insulating layer, and wherein the first insulating layer includes filler grains.

According to another aspect of an embodiment, there is provided a semiconductor package including an intervening redistribution substrate including an intervening redistribution insulating layer and an intervening redistribution via, a first insulating layer on the intervening redistribution substrate, a solder pad on the first insulating layer, a solder via on the solder pad electrically connected to the solder pad, and a first alignment key spaced apart from the solder via and penetrating the first insulating layer, wherein the first alignment key includes a first key body extending from a first surface of the first insulating layer into an inside of the intervening redistribution substrate, and a first key protrusion protruding from a side surface of the first key body toward the first insulating layer, and wherein the first insulating layer includes a non-photosensitive material.

BRIEF DESCRIPTION OF DRAWINGS

The above and other aspects, features, and advantages of example embodiments of the disclosure will be more apparent from the following description taken in conjunction with the accompanying drawings, in which.

DETAILED DESCRIPTION

Figure 1:
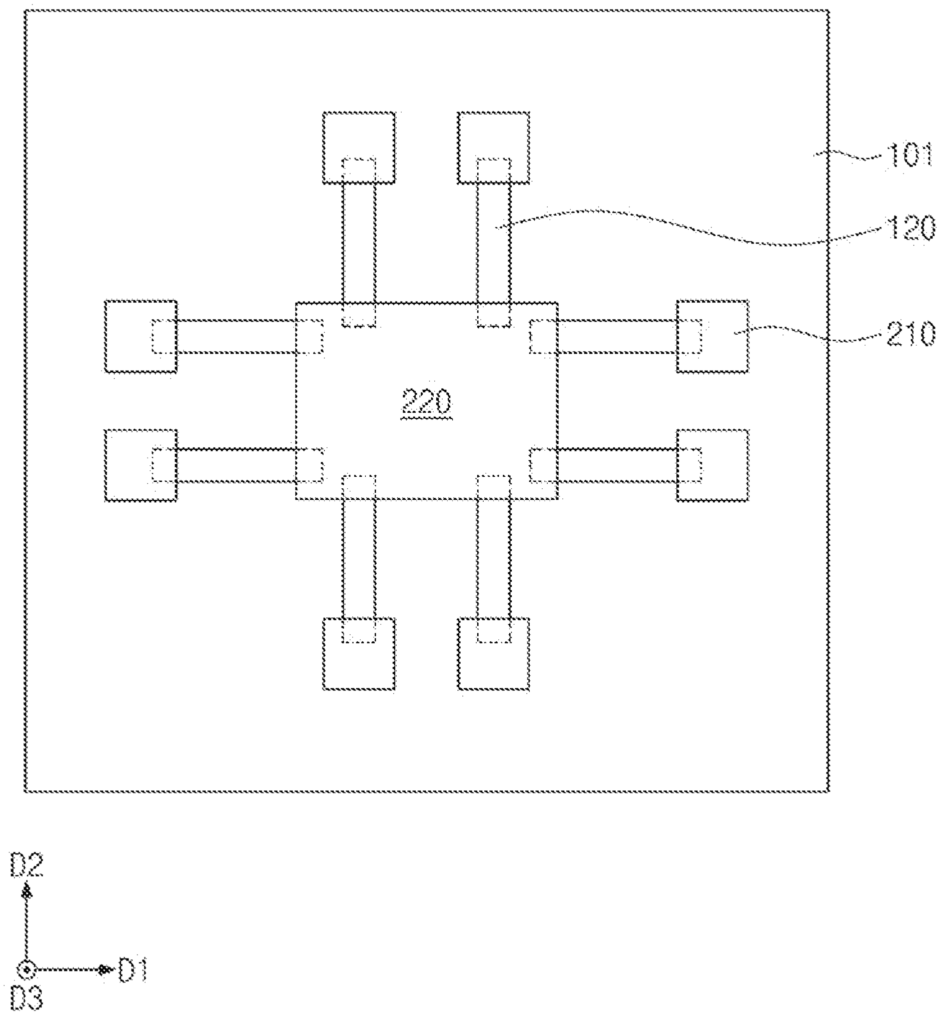
FIG. 1 is a plan view illustrating a semiconductor package according to embodiments.

In this specification, the same reference numerals may refer to the same elements throughout. A semiconductor package and a method of manufacturing the same according to embodiments will be described.

Embodiments described herein are example embodiments, and thus, the disclosure is not limited thereto.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

It will be understood that, although the terms first, second, third, fourth, etc. may be used herein to describe various elements, components, regions, layers and/or sections (collectively "elements"), these elements should not be limited by these terms. These terms are only used to distinguish one element from another element. Thus, a first element described in this description section may be termed a second element or vice versa in the claim section without departing from the teachings of the disclosure.

Figure 2:
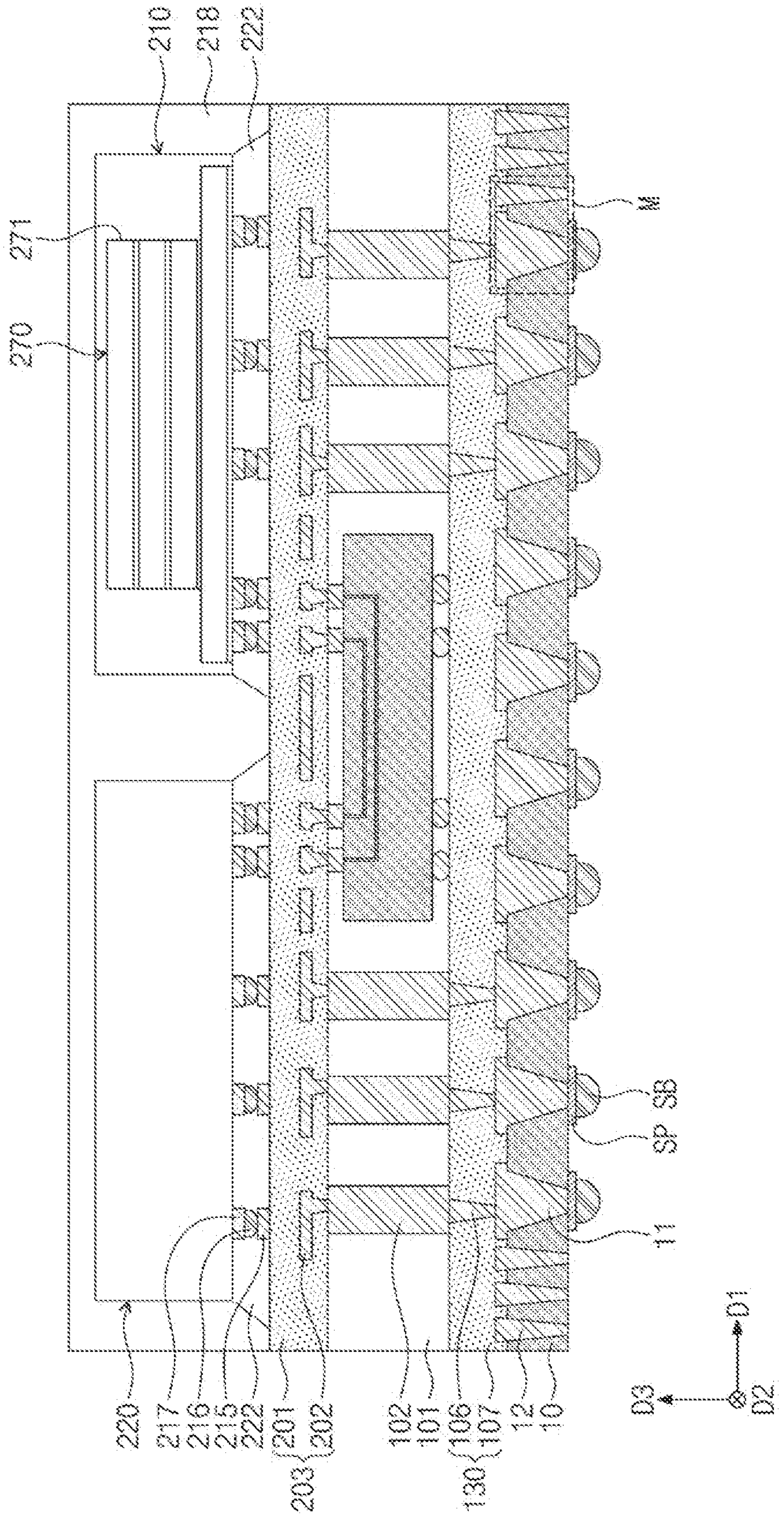
FIG. 2 is a cross-sectional view illustrating a semiconductor package according to embodiments.
Figure 3:
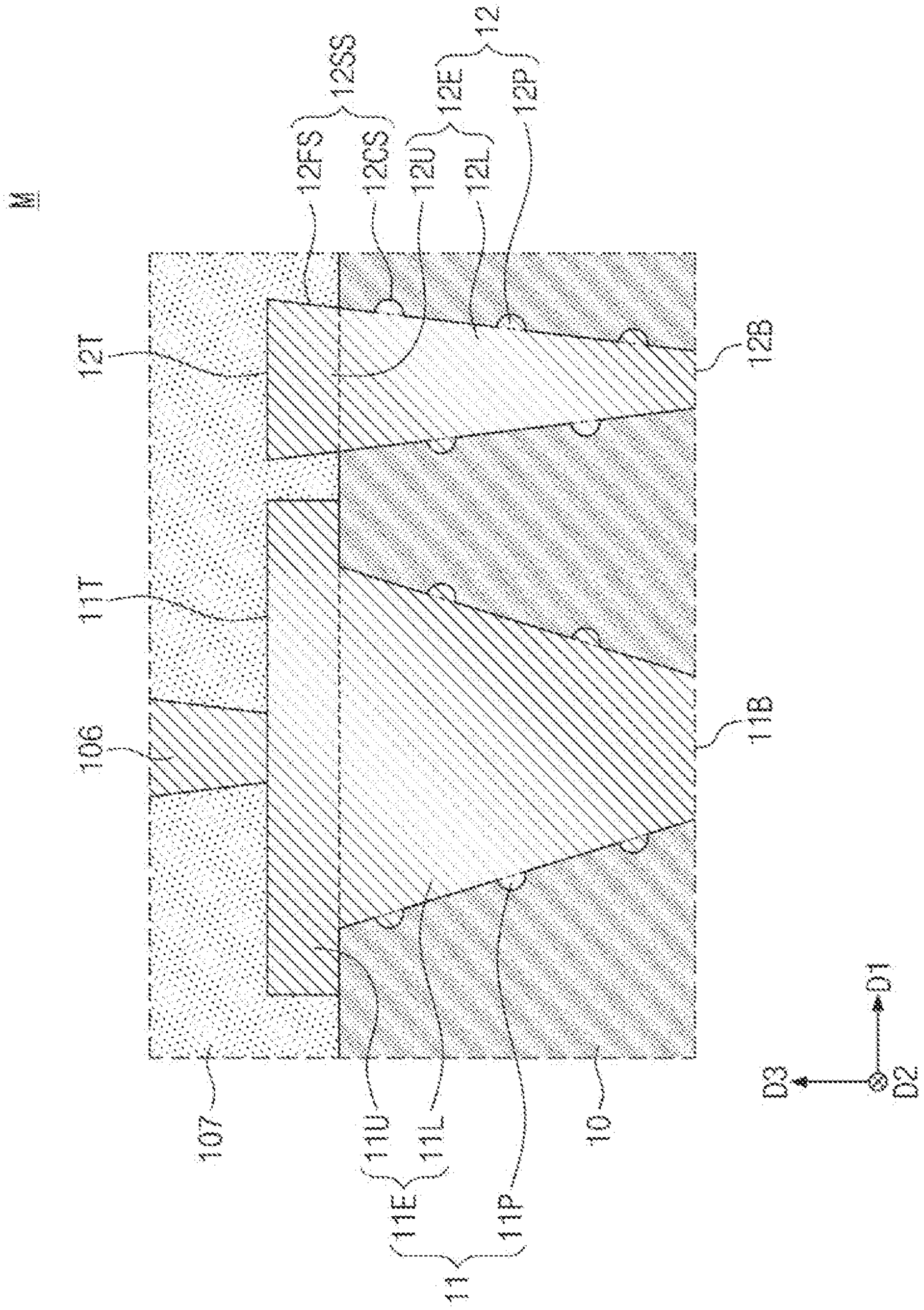
FIG. 3 is an enlarged view of portion 'M' of FIG. 2.

FIG. 1 is a plan view illustrating a semiconductor package according to embodiments. FIG. 2 is a cross-sectional view illustrating a semiconductor package according to embodiments. FIG. 3 is an enlarged view of portion 'M' of FIG. 2.

Referring to FIGS. 1 to 3, a first redistribution substrate 130 may be provided. The first redistribution substrate 130 may include a first redistribution insulating layer 107 and a first redistribution via 106. The first redistribution insulating layer 107 may include an organic material such as a photo-imageable dielectric (PID) material. The photo-imageable dielectric may be a polymer. The photo-imageable dielectric may include, for example, at least one of photosensitive polyimide, polybenzoxazole, phenol-based polymer, and benzocyclobutene-based polymer. A plurality of first redistribution insulating layers 107 may be provided. The number of stacked first redistribution insulating layers 107 may vary according to embodiments. As an example, the plurality of first redistribution insulating layers 107 may include the same material as each other, and an interface between adjacent first redistribution insulating layers 107 may not be distinguished.

The first redistribution via 106 may be provided within the first redistribution insulating layer 107. The first redistribution via 106 may include a conductive material.

A first insulating layer 10 may be provided under the first redistribution substrate 130. The first insulating layer 10 may include a non-photosensitive material. The first insulating layer 10 may be, for example, an Ajinomoto Build-up Film (ABF) layer. The first insulating layer 10 may include impurities. The first insulating layer 10 may include, for example, filler grains.

A first direction D1 may be parallel to an upper surface of the first redistribution substrate 130. A second direction D2 may be parallel to the upper surface of the first redistribution substrate 130 and may be substantially perpendicular to the first direction D1. The first direction D1 and the second direction D2 may intersect. A third direction D3 may be substantially perpendicular to the upper surface of the first redistribution substrate 130. The first direction D1 and the second direction D2 may be horizontal directions and the third direction D3 may be a vertical direction.

A first alignment key 12 and a solder via 11 may be provided to penetrate the first insulating layer 10. The first alignment key 12 may include a plurality of first alignment keys 12. The solder via 11 may include a plurality of solder vias 11. The solder vias 11 may be disposed between the plurality of first alignment keys 12.

The solder via 11 may be in contact with the first insulating layer 10 and the first redistribution insulating layer 107. The solder via 11 may penetrate the first insulating layer 10 and extend into the first redistribution insulating layer 107. The solder via 11 may include a conductive material. The solder via 11 may be connected to the first redistribution via 106. The solder via 11 may be spaced apart from the first alignment key 12. A lower surface 11B of the solder via 11 may be in contact with a solder pad SP.

A solder pad SP may be provided such that a lower surface of the solder via 11 is in contact with the solder pad SP. The solder pad SP may include a conductive material. A solder ball SB may be provided under the solder pad SP. The solder ball SB, solder pad SP, and solder via 11 may be electrically connected to each other. The solder ball SB may include solder materials such as tin, lead, silver, and alloys thereof.

The solder via 11 may include a solder via body 11E extending from a lower surface of the first insulating layer 10 to the inside of the first redistribution substrate 130, and a solder via protrusion 11P protruding from a side of the solder via body 11E toward the first insulating layer 10. The solder via protrusion 11P may be formed in a process of laser cutting impurities in the first insulating layer 10. For example, the solder via protrusion 11P may be formed with an uneven cut cross section formed in the process of laser cutting the filler grain of the first insulating layer 10 and the first insulating layer 10, and then may be formed during a subsequent plating process. The solder via protrusion 11P may have a uniform shape. In one embodiment, the solder via protrusion 11P may have a non-uniform shape.

The solder via body 11E may include a first upper solder via body 11U in contact with the first redistribution insulating layer 107 and a first lower solder via body 11L in contact with the first insulating layer 10. The solder via protrusion 11P may be formed on the first lower solder via body 11. A width of the first alignment key 12 in a first direction D1 (horizontal direction) may increase as the first alignment key 12 moves away from the lower surface of the first insulating layer 10 in the third direction D3 (vertical direction). The first upper solder via body 11U may not include the solder via protrusion 11P.

The first alignment key 12 may penetrate the first insulating layer 10. The first alignment key 12 may extend from the lower surface of the first insulating layer 10 to the inside of the first redistribution insulating layer 107 of the first redistribution substrate 130. The first alignment key 12 may be electrically floating. The first alignment key 12 may include a conductive material. The first alignment key 12 may include the same material as the solder via 11.

A lower surface 12B of the first alignment key 12 may be exposed from the first insulating layer 10. A side surface 12SS of the first alignment key 12 may be in contact with the first insulating layer 10 and the first redistribution insulating layer 107, and the upper surface 12T of the first alignment key 12 may be in contact with the first redistribution layer 107.

A level of the upper surface 12T of the first alignment key 12 may be the same as a level of the upper surface 11T of the solder via 11 in the third direction D3 (vertical direction). The upper surface 11T of the solder via 11 may be in contact with the first redistribution insulating layer 107 and the first redistribution via 106.

The first alignment key 12 may include a first key body 12E extending from the lower surface of the first insulating layer 10 into the inside of the first redistribution substrate 130, and a first key protrusion 12P protruding from a side of the first key body 12E toward the first insulating layer 10. The first key protrusion 12P may be formed in a process of laser cutting impurities in the first insulating layer. The first key protrusion 12P may be formed with an uneven cut cross section formed in the process of laser cutting the filler grain of the first insulating layer 10 and the first insulating layer 10, and may be formed during the subsequent plating process. The protrusion 12P may have a uniform shape. In one embodiment, the first key protrusion 12P may have a non-uniform shape.

The first key body 12E may include a first upper key body 12U in contact with the first redistribution insulating layer 107 and a first lower key body 12L in contact with the first insulating layer 10. The first key protrusion 12P may be formed on the first lower key body 12. A width of the first alignment key 12 in the first direction D1 (horizontal direction) may increase as the first alignment key 12 moves away from the lower surface of the first insulating layer 10 in the third direction D3 (vertical direction). The first upper key body 12U may not include the first key protrusion 12P.

A side surface 12SS of the first alignment key 12 may include a flat surface 12FS and a curved surface 12CS. The flat surface 12FS may be in contact with the first redistribution insulating layer 107 and the first insulating layer 10. The curved surface 12CS may be a side surface of the first key protrusion 12P. The curved surface 12CS may be in contact with the first insulating layer 10. The flat surface 12FS and the curved surface 12CS may be continuous.

A side surface of the first upper key body 12U may include a flat surface 12FS. The side surface of the first lower key body 12L may include a flat surface 12FS and a curved surface 12CS.

A mold insulating layer 101 may be provided on the first redistribution substrate 130. A penetrating structure 102 may be provided to penetrate the mold insulating layer 101. The penetrating structure 102 and the first redistribution via 106 may be electrically connected. The penetrating structure 102 may include a conductive material. The penetrating structure 102 may include, for example, copper.

A bridge 120 may be provided between the plurality of penetrating structures 102. The bridge 120 may include a bridge conductive line 122 and a bridge substrate 121. The bridge substrate 121 may further include integrated circuits.

In an embodiment, the bridge substrate 121 may be a semiconductor substrate such as, for example, a silicon substrate. In an embodiment, the bridge substrate 121 may be an organic substrate. In this case, the bridge substrate 121 may include insulating polymer.

The bridge conductive line 122 may include a conductive material. A first semiconductor structure 210 and a second semiconductor chip 220, which will be described later, may be electrically connected through the bridge conductive line 122.

A bridge pad 105 may be provided on the bridge 120. The bridge pad 105 may be electrically connected to the bridge conductive line 122.

A bridge bump 104 may be provided under the bridge 120. The bridge bump 104 may electrically connect the bridge 120 and the first redistribution substrate 130.

A second redistribution substrate 203 may be disposed on the mold insulating layer 101. The second redistribution substrate 203 may include a second redistribution insulating layer 201 and a redistribution pattern 202. The second redistribution insulating layer 201 may be a photo-imageable dielectric. The redistribution pattern 202 may include a conductive material. The second redistribution substrate 203 and the penetrating structure 102 may be electrically connected. The second redistribution substrate 203 and the bridge 102 may be electrically connected.

A first semiconductor structure 210 and a second semiconductor chip 220 may be provided on the second redistribution substrate 203. The first semiconductor structure 210 may include a first semiconductor chip 271. The first semiconductor structure 210 may include a plurality of first semiconductor chips 271. The first semiconductor structure 210 may include a first semiconductor chip structure 270 in which a plurality of first semiconductor chips 271 are stacked.

The second semiconductor chip 220 may be provided to be spaced apart from the first semiconductor structure 210. The second semiconductor chip 220 may be, for example, a logic chip.

A lower adhesive pad 215 between the second redistribution substrate 203 and the first semiconductor structure 210, an adhesive bump 216, and an upper adhesive pad 217 on the adhesive bump 216 may be provided. The lower adhesive pad 215, the adhesive bump 216, the adhesive bump 216, and the upper adhesive pad 217 may include a conductive material. An adhesive layer 222 may be interposed between the second redistribution substrate 203 and the first semiconductor structure 210 to surround the lower adhesive pad 215, adhesive bump 216, adhesive bump 216 and upper adhesive pad 217. The adhesive layer 222 may include an insulating material.

Similarly, a lower adhesive pad 215, an adhesive bump 216, an upper adhesive pad 217 on the adhesive bump 216, and an adhesive layer 222 may be disposed between the second redistribution substrate 203 and the second semiconductor chip 220.

A molding layer 218 may be provided on a side surface and an upper surface of the first semiconductor structure 210 and the second semiconductor chip 220 and on the side surface of the adhesive layer 222. The molding layer 218 may be provided on the second redistribution substrate 203. The molding layer 218 may include an insulating material. The molding layer 218 may include a silicon-based insulating material such as silicon oxide.

FIGS. 4, 5, 6, 7, 8, and 9 are views illustrating a method of manufacturing a semiconductor package according to embodiments.

Figure 4:
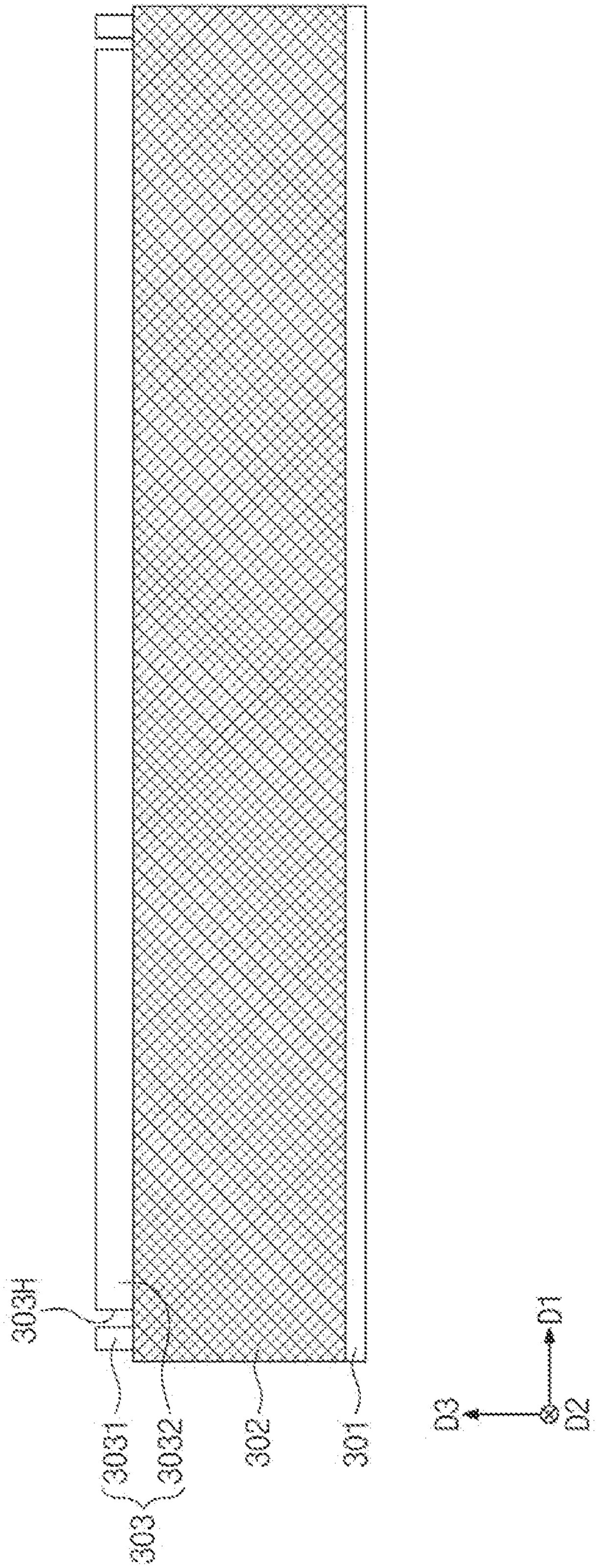
FIGS. 4, 5, 6, 7, 8, and 9 are views illustrating a method of manufacturing a semiconductor package according to embodiments.

Referring to FIG. 4, a first core conductive layer 301 and a core insulating layer 302 on the first core conductive layer 301 may be provided. A second core conductive layer 303 may be provided on the core insulating layer 302.

The first core conductive layer 301 may include a conductive material. The first core conductive layer 301 may include, for example, copper. The core insulating layer 302 may include an insulating material. The second core conductive layer 303 may include a conductive material. In an embodiment, the second core conductive layer 303 may include a plurality of conductive layers, and a release layer may be interposed between the plurality of conductive layers. In one embodiment, the first core conductive layer 301, the core insulating layer 302, and the second core conductive layer 303 may form a detach core film (DCF).

The second core conductive layer 303 may include a first key core portion 3031 and a second key core portion 3032. The first key core portion 3031 and the second key core portion 3032 may be spaced apart from each other. A key core hole 303H may be formed between the first key core portion 3031 and the second key core portion 3032. The second core conductive layer 303 may be patterned and then etched to form the first key core portion 3031, the second key core portion 3032, and the key core hole 303H, and to expose a portion of an upper surface of the core insulating layer 302. The first key core portion 3031, the second key core portion 3032, and the key core hole 303H may function as an alignment key.

Figure 5:
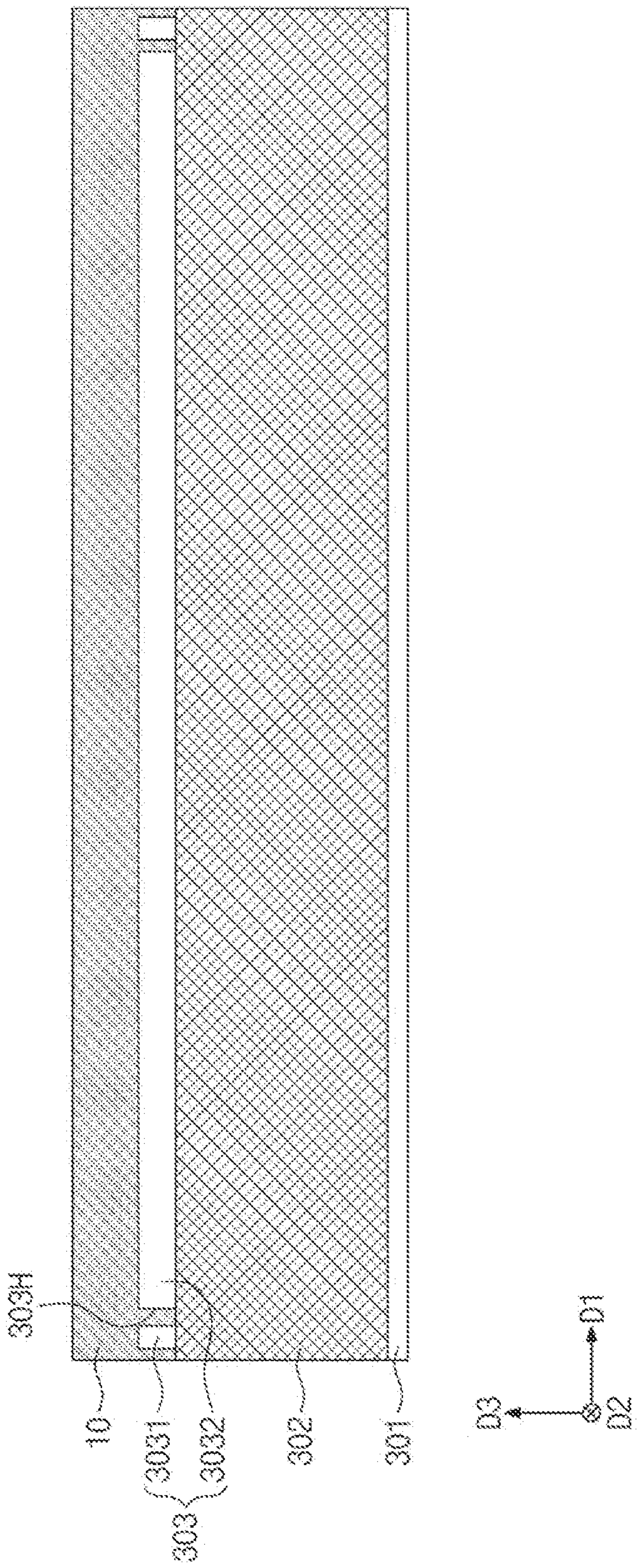

Referring to FIG. 5, a first insulating layer 10 may be formed on the exposed core insulating layer 302 and the second core conductive layer 303. The first insulating layer 10 may be formed through a deposition process. The deposition process may be, but is not limited to, a chemical vapor deposition (CVD) process. The first insulating layer 10 may be formed, for example, by depositing a non-photosensitive material on the exposed core insulating layer 302 and the second core conductive layer 303 to fill the key core hole 303H.

Figure 6:
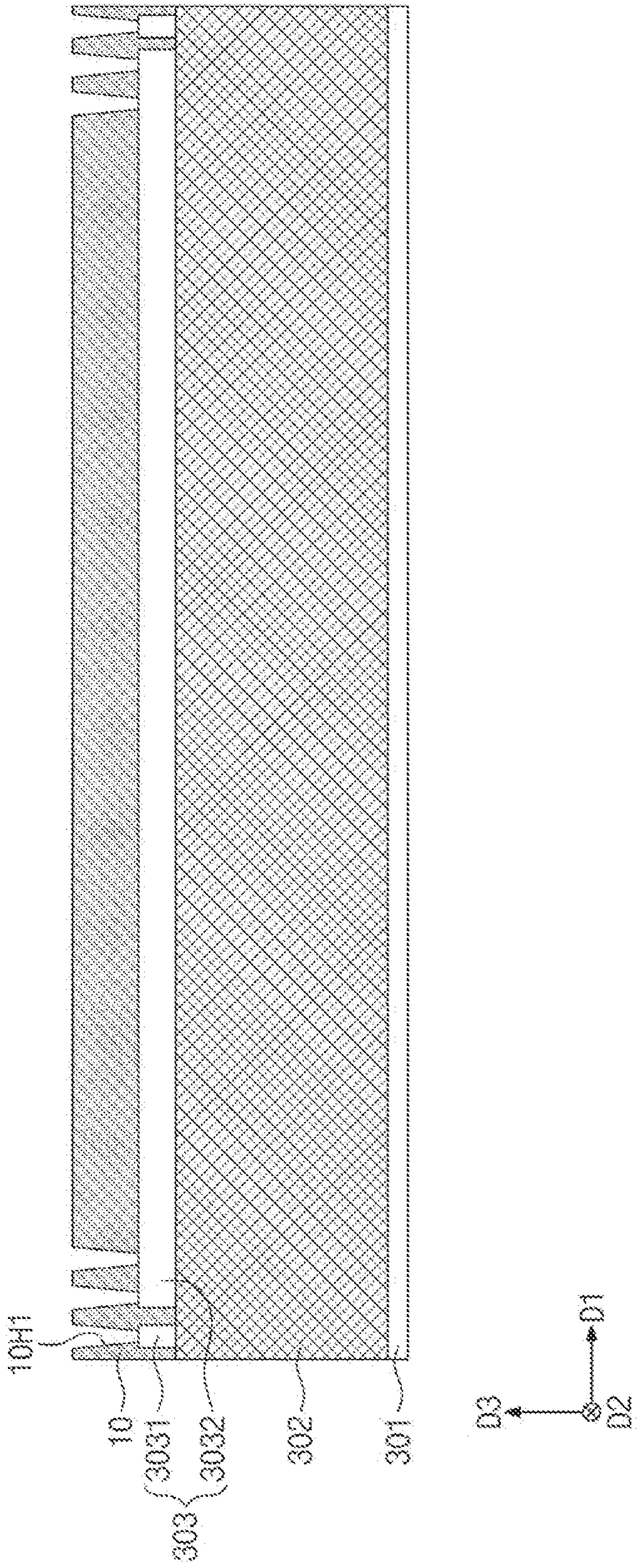

Referring to FIG. 6, a portion of the first insulating layer 10 may be removed. The first insulating layer 10 may be removed through, for example, laser etching. The first insulating layer 10 may be etched to form the first hole 10H. The first hole 10H1 may include a plurality of first holes 10H1. The plurality of first holes 10H1 may be formed at both ends of the first insulating layer 10 to be spaced apart from each other.

A side surface of the first hole 10H1 may include an inclined surface. A width of the first hole 10H1 may become narrower as the first hole 10H1 approaches the second core conductive layer 303. By forming the first hole 10H1, a portion of the upper surface of the second core conductive layer 303 may be exposed.

Figure 7:
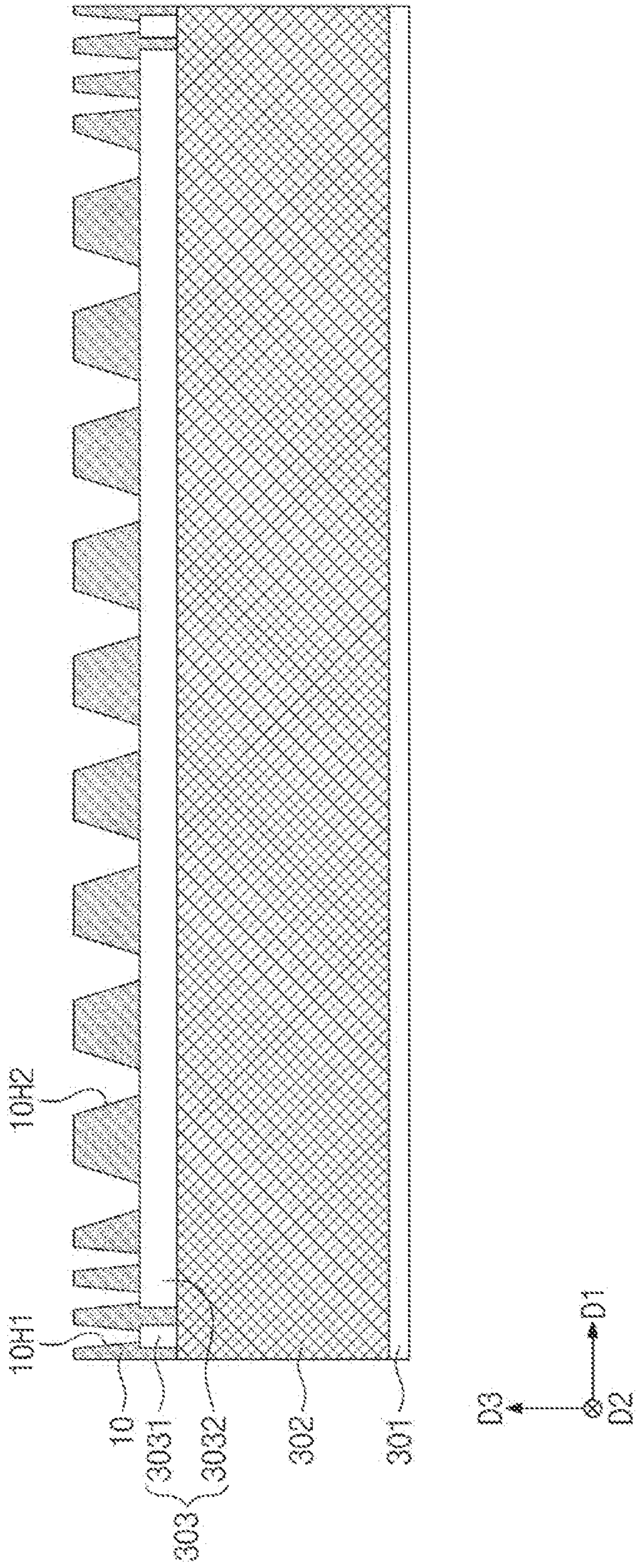

Referring to FIG. 7, the first insulating layer 10 may be additionally etched to form a second hole 10H2. The second hole 10H2 may include a plurality of second holes 10H2. The plurality of second holes 10H2 may be formed between the plurality of first holes 10H1. As the second holes 10H2 are formed, a portion of the upper surface of the second core conductive layer 303 may be exposed. A side surface of the second hole 10H2 may include an inclined surface.

In one embodiment, the first holes 10H1 and the second holes 10H2 may be formed simultaneously. In this case, as the first insulating layer 10 is laser etched, first holes 10H1 and second holes 10H2 having different widths may be formed simultaneously.

In an embodiment, the plurality of first holes 10H1, the plurality of second holes 10H2, and a plurality of first holes 10H1 may be sequentially provided in the first direction D1 on the core insulating layer 302 and the second core conductive layer 303. The greatest width of the plurality of second holes 10H2 may be larger than the greatest width of the plurality of first holes 10H1.

Figure 8:
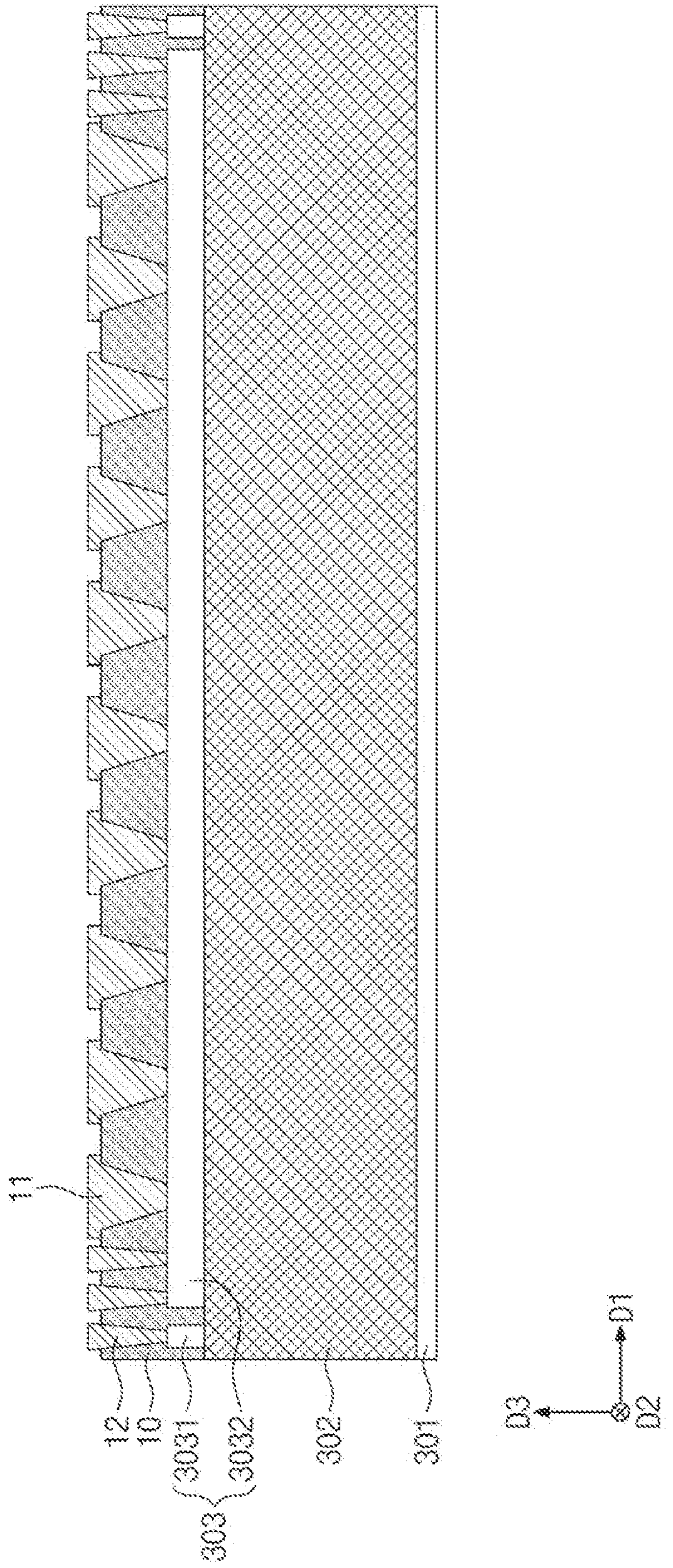

Referring to FIG. 8, a first alignment key 12 may be formed on the first holes 10H1 and a solder via 11 may be formed on the second holes 10H2. The first alignment key 12 and the solder via 11 may be formed simultaneously. Forming the first alignment key 12 and the solder via 11 may include, for example, depositing a conductive material on the first holes 10H1, the second holes 10H2, and the first insulating layer 10, and removing and patterning a portion of the conductive material. The first alignment key 12 and the solder via 11 may be formed to be spaced apart from each other, and the first alignment key 12 and the solder via 11 may include the same material.

Figure 9:
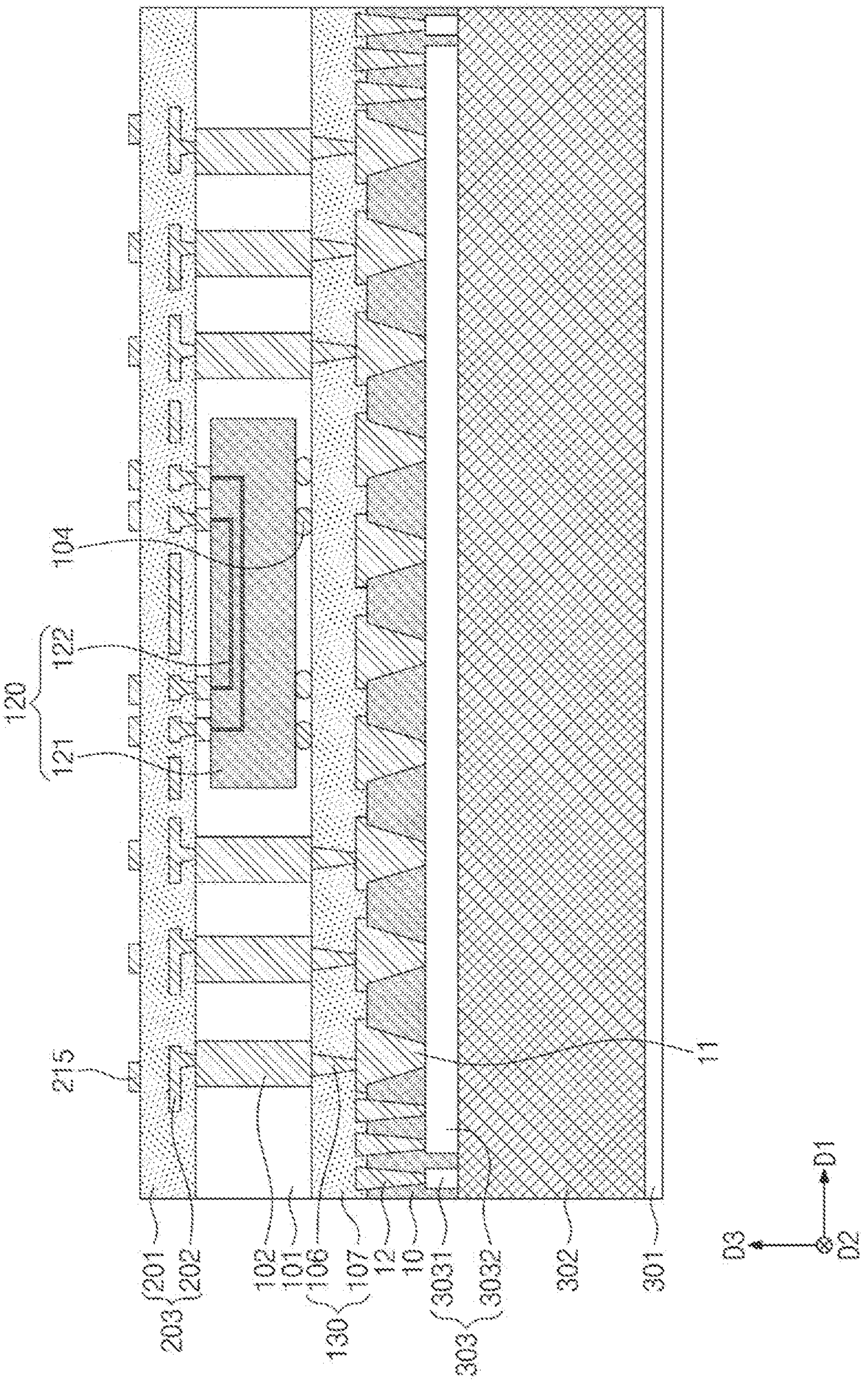

Referring to FIG. 9, a first redistribution substrate 130 may be formed. A first redistribution via 106 may be formed on the solder via 11. A first redistribution insulating layer 107 may be formed on the solder via 11 and the first alignment key 12. The first redistribution substrate 130 may be formed by forming the first redistribution via 106 and the first redistribution insulating layer 107. The first redistribution substrate 130 may be formed through a wafer level process. The first redistribution substrate 130 may be formed by forming the first redistribution insulating layer 107 and forming the first redistribution via 106. The first redistribution substrate 130 may be formed by, for example, depositing the first redistribution insulating layer 107 on the first alignment key 12 and the solder via 11, forming a hole in which the first redistribution via 106 will be formed through patterning, and filling the hole with a conductive material to form the first redistribution via 106.

A mold insulating layer 101, a penetrating structure 102, and a bridge 120 may be formed on the first redistribution substrate 130. In an embodiment, a bridge bump 104, a bridge 120, a bridge pad 105, and a penetrating structure 102 may be formed on the first redistribution substrate 130 and covered with a mold insulating layer 101.

Afterwards, a grinding process may be performed on the mold insulation layer 101 and the penetrating structure 102. Through the grinding process, upper portions of the mold insulation layer 101 and penetrating structure 102 may be removed. For example, the grinding process may be a chemical mechanical polishing process. As a result of the grinding process, the upper portions of the mold insulating layer 101 and penetrating structure 102 may be removed. After the grinding process, an exposed upper surface of the penetrating structure 102 may be provided at substantially the same level as an upper surface of the mold insulating layer 101 in the third direction D3 (vertical direction).

The second redistribution substrate 203 may be formed on the mold insulating layer 101 and the upper surfaces of the penetrating structure 102. The second redistribution substrate 203 may be formed through a wafer level process. The second redistribution substrate 203 may be formed by forming a second redistribution insulating layer 201 and forming a redistribution pattern 202. A lower adhesive pad 215 may be formed on the second redistribution substrate 203.

Referring again to FIG. 1, an adhesive bump 216 and an upper adhesive pad 217 may be formed on the lower adhesive pad 215, and an adhesive layer 222 and a first semiconductor structure 210 may be provided on the upper adhesive pad 217. An adhesive layer 222 and a second semiconductor chip 220 may be provided on the upper adhesive pad 217. The first semiconductor structure 210 and the second semiconductor chip 220 may be fixed on the second redistribution substrate 203 through the adhesive layer 222.

A molding layer 218 may be formed on the second redistribution substrate 203, the adhesive layer 222, the first semiconductor structure 210, and the second semiconductor chip 220. The molding layer 218 may be formed by depositing an insulating material.

The first core conductive layer 301, core insulating layer 302, and core insulating layer 302 may be removed. Thereafter, the solder pad SP and solder ball SB may be attached under the solder via 11.

Figure 10:
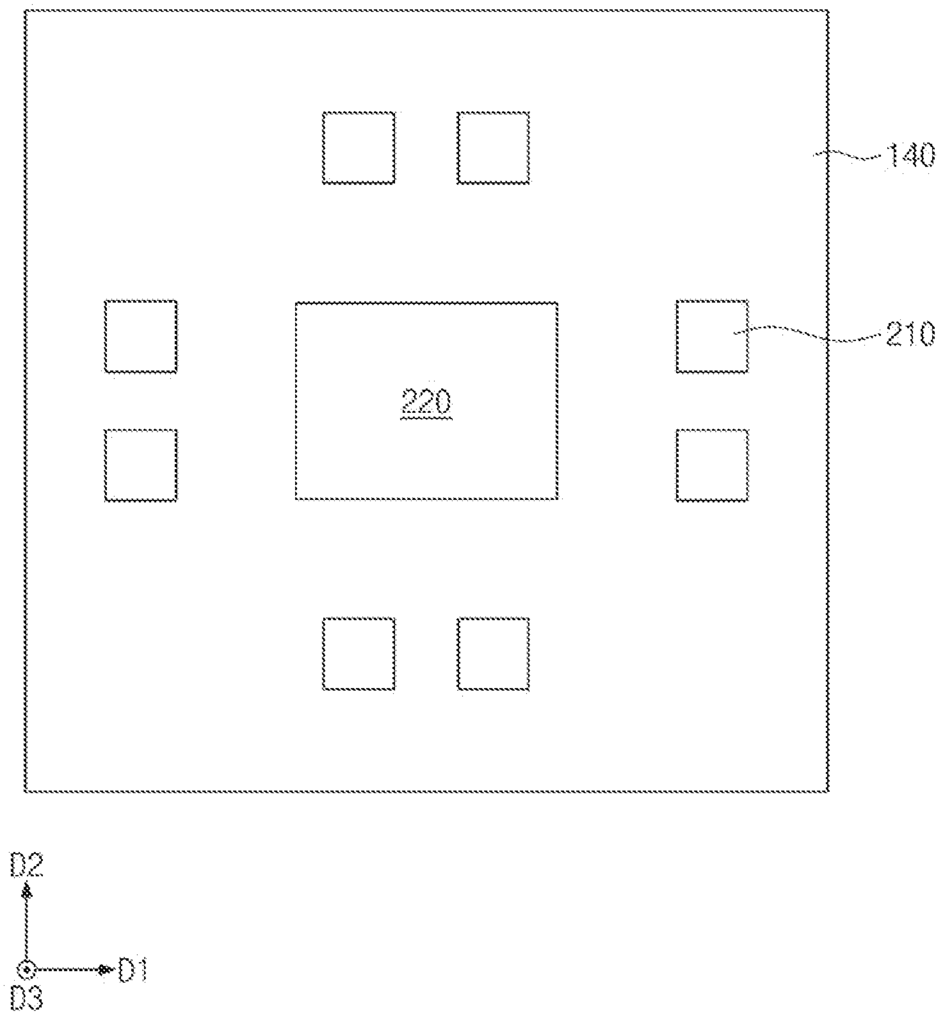
FIG. 10 is a plan view illustrating a semiconductor package according to embodiments.
Figure 11:
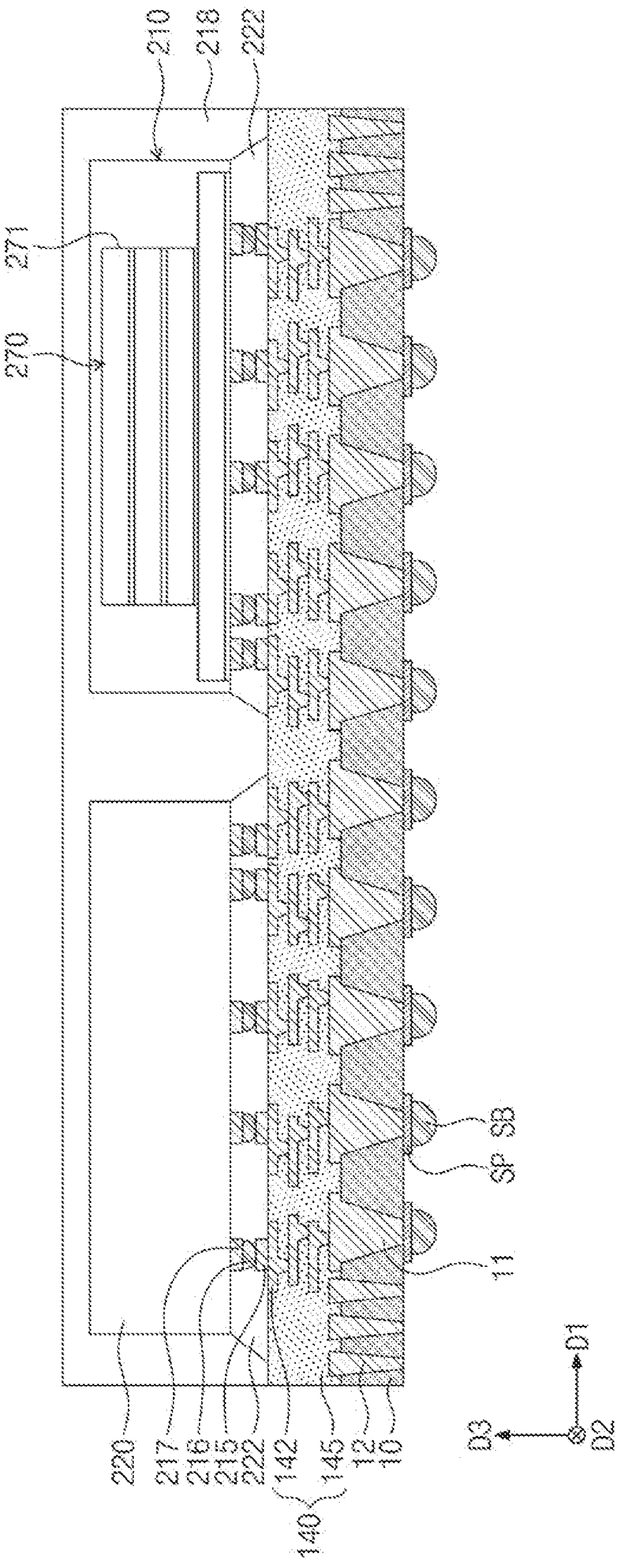
FIG. 11 is a cross-sectional view illustrating a semiconductor package according to embodiments.

FIG. 10 is a plan view illustrating a semiconductor package according to embodiments. FIG. 11 is a cross-sectional view illustrating a semiconductor package according to embodiments. To simplify the explanation, the description will focus on the differences from FIGS. 1 and 2.

According to FIGS. 10 and 11, an intervening redistribution substrate 140 may be provided. The intervening redistribution substrate 140 may include an intervening redistribution insulating layer 145 and an intervening redistribution line pattern 142.

The intervening redistribution insulating layer 145 may include an organic material such as a photo-imageable dielectric. The photo-imageable dielectric may be a polymer. A plurality of intervening redistribution insulating layers 145 may be provided. The number of stacked intervening redistribution insulating layers 145 may be various. As an example, the plurality of intervening redistribution insulating layers 145 may include the same material. An interface between adjacent intervening redistribution insulating layers 145 may not be distinguished.

The intervening redistribution pattern 142 may be provided within the intervening redistribution insulating layer 145. The intervening redistribution pattern 142 may include a conductive material. The intervening redistribution pattern 142 may include a plurality of intervening redistribution patterns 142.

A first insulating layer 10 may be provided under the intervening redistribution substrate 140. The first insulating layer 10 may include a non-photosensitive material. The first insulating layer 10 may be, for example, an ABF layer. The first insulating layer 10 may include impurities. The first insulating layer 10 may include, for example, filler grains.

A first alignment key 12 and a solder via 11 may be provided to penetrate the first insulating layer 10. The first alignment key 12 may include a plurality of first alignment keys 12. The solder via 11 may include a plurality of solder vias 11. The solder vias 11 may be disposed between the plurality of first alignment keys 12.

Similar to the first alignment keys 12 of FIG. 3, the first alignment keys 12 may include a first key body extending from a lower surface of the first insulating layer 10 to the inside of the intervening redistribution substrate 140, and a first key protrusion protruding from a side of the key body toward the first insulating layer 10.

The solder via 11 may be in contact with the first insulating layer 10 and the intervening redistribution insulating layer 145. The solder via 11 may penetrate the first insulating layer 10 and extend into the intervening redistribution insulating layer 145. The solder via 11 may include a conductive material. The solder via 11 may be connected to the intervening redistribution pattern 142. The solder via 11 may be spaced apart from the first alignment key 12. The lower surface of the solder via 11 may be in contact with a solder pad SP.

The solder pad SP may be provided such that a lower surface of the solder via 11 is in contact with the solder pad SP. The solder pad SP may include a conductive material. A solder ball SB may be provided under the solder pad SP. The solder ball SB, solder pad SP, solder via 11, and intervening redistribution pattern 142 may be electrically connected.

A first semiconductor structure 210 and a second semiconductor chip 220 may be provided on the intervening redistribution substrate 140. The first semiconductor structure 210 may include a first semiconductor chip 271. The first semiconductor structure 210 may include a plurality of first semiconductor chips 271. The first semiconductor structure 210 may include a first semiconductor chip structure 270 in which a plurality of first semiconductor chips 271 are stacked.

The second semiconductor chip 220 may be provided to be spaced apart from the first semiconductor structure 210. The second semiconductor chip 220 may be, for example, a logic chip.

A lower adhesive pad 215, an adhesive bump 216, and an upper adhesive pad 217 may be disposed on the adhesive bump 216 between the second redistribution substrate 203 and the first semiconductor structure 210. An adhesive layer 222 may be interposed between the second redistribution substrate 203 and the first semiconductor structure 210 to surround the lower adhesive pad 215, adhesive bump 216, adhesive bump 216 and upper adhesive pad 217.

Similarly, between the second redistribution substrate 203 and the second semiconductor chip 220, a lower adhesive pad 215, an adhesive bump 216, an upper adhesive pad 217 on the adhesive bump 216, and an adhesive layer 222 may be disposed.

A molding layer 218 may be provided on a side surface and an upper surface of the first semiconductor structure 210 and the second semiconductor chip 220, and on a side surface of the adhesive layer 222.

The first semiconductor chip 271 and the second semiconductor chip 220 of the first semiconductor structure 210 may be electrically connected through the intervening redistribution substrate 140.

According to embodiments, the first alignment key may be provided under the first redistribution substrate. The first alignment key and solder via may be formed simultaneously by laser cutting the first insulating layer, and the first redistribution layer may be formed directly on the first insulating layer. Accordingly, the semiconductor package may be formed through a more simplified process without the photo process or grinding process.

While embodiments are described above, a person skilled in the art may understand that many modifications and variations are made without departing from the spirit and scope as defined in the following claims and their equivalents. Accordingly, the example embodiments should be considered in all respects as illustrative and not restrictive, with the spirit and scope of the inventive concept being indicated by the appended claims and their equivalents.

What is claimed is:

1. A semiconductor package comprising:

a first redistribution substrate comprising a first redistribution insulating layer and a first redistribution via;

a first insulating layer on the first redistribution substrate;

a solder pad on the first insulating layer;

a first alignment key penetrating the first insulating layer and extending to an inside of the first redistribution insulating layer; and a solder via spaced apart from the first alignment key and electrically connected to the solder pad, wherein the first alignment key comprises a first key body extending from a first surface of the first insulating layer to the inside of the first redistribution substrate, and a first key protrusion protruding from a side surface of the first key body toward the first insulating layer, and wherein the first insulating layer comprises a non-photosensitive material.

2. The semiconductor package of claim 1, wherein a level of an upper surface of the solder via is the same as a level of an upper surface of the first alignment key.

3. The semiconductor package of claim 1, further comprising:

a bridge on the first redistribution substrate;

a second redistribution substrate on the bridge;

a first semiconductor chip and a second semiconductor chip on the second redistribution substrate, wherein the bridge overlaps the first semiconductor chip and the second semiconductor chip in a vertical direction, and is configured to electrically connect the first semiconductor chip and the second semiconductor chip.

4. A semiconductor package comprising:

a first redistribution substrate comprising a first redistribution insulating layer and a first redistribution via;

a first insulating layer on the first redistribution substrate;

a solder pad on the first insulating layer;

a first alignment key penetrating the first insulating layer and extending to an inside of the first redistribution insulating layer; and a solder via spaced apart from the first alignment key and electrically connected to the solder pad, wherein the first alignment key comprises:

a first key body extending from a first surface of the first insulating layer into the inside of the first redistribution substrate; and a first key protrusion protruding from a side surface of the first key body toward the first insulating layer, and wherein the first insulating layer comprises filler grains.

5. The semiconductor package of claim 4, wherein the first alignment key is electrically floating.

6. The semiconductor package of claim 4, wherein a first surface of the first alignment key is exposed, wherein a side surface of the first alignment key is in contact with the first insulating layer and the first redistribution insulating layer, and wherein a second surface of the first alignment key is in contact with the first redistribution insulating layer.

7. The semiconductor package of claim 4, wherein the first redistribution insulating layer comprises a photo-imageable dielectric, and wherein the first insulating layer comprises a non-photosensitive material.

8. The semiconductor package of claim 4, further comprising:

a bridge on the first redistribution substrate;

a second redistribution substrate on the bridge;

a first semiconductor chip and a second semiconductor chip on the second redistribution substrate, wherein the bridge is configured to electrically connect the first semiconductor chip and the second semiconductor chip.

9. The semiconductor package of claim 8, further comprising a penetrating structure configured to electrically connect the first redistribution substrate and the second redistribution substrate, wherein the bridge is between the penetrating structures.

10. The semiconductor package of claim 8, wherein the second redistribution substrate and the first semiconductor chip are electrically connected through a chip pad and a chip solder, wherein the chip pad comprises a lower chip pad and an upper chip pad, and wherein the lower chip pad comprises a plurality of metal layers.

11. The semiconductor package of claim 4, wherein a level of a first surface of the solder via is the same as a level of a first surface of the first alignment key in a vertical direction.

12. The semiconductor package of claim 4, wherein the first key body comprises:

a first upper key body in contact with the first redistribution insulating layer, and a first lower key body in contact with the first insulating layer, and wherein the first key protrusion is on the first lower key body.

13. A semiconductor package comprising:

an intervening redistribution substrate comprising an intervening redistribution insulating layer and an intervening redistribution via;

a first insulating layer on the intervening redistribution substrate;

a solder pad on the first insulating layer;

a solder via on the solder pad electrically connected to the solder pad; and a first alignment key spaced apart from the solder via and penetrating the first insulating layer, wherein the first alignment key comprises a first key body extending from a first surface of the first insulating layer into an inside of the intervening redistribution substrate, and a first key protrusion protruding from a side surface of the first key body toward the first insulating layer, and wherein the first insulating layer comprises a non-photosensitive material.

14. The semiconductor package of claim 13, wherein the intervening redistribution insulating layer comprises a photo-imageable dielectric, and wherein the first insulating layer comprises filler grains.

15. The semiconductor package of claim 13, wherein a width of the first alignment key in a horizontal direction increases as a distance from a first surface of the first insulating layer increases in the vertical direction.

16. The semiconductor package of claim 13, wherein the first alignment key is electrically floating, and wherein a first surface of the first alignment key is exposed, and a first surface of the solder via is in contact with a solder pad.

17. The semiconductor package of claim 13, wherein a side surface of the first alignment key comprises:

a flat surface in contact with the intervening redistribution insulating layer and the first insulating layer; and a curved surface in contact with the first insulating layer, the curved surface being a side surface of the first key protrusion, and wherein the flat surface and the curved surface are continuous.

18. The semiconductor package of claim 17, wherein the first key body comprises:

a first upper key body in contact with the intervening redistribution insulating layer, and a first lower key body in contact with the first insulating layer, and wherein a side surface of the first lower key body comprises a curved surface.

19. The semiconductor package of claim 13, wherein a level of a second surface of the solder via is the same as a level of a second surface of the first alignment key in the vertical direction.

20. The semiconductor package of claim 13, further comprising a first semiconductor chip and a second semiconductor chip on the intervening redistribution substrate, wherein the intervening redistribution substrate is configured to electrically connect the first semiconductor chip and the second semiconductor chip.

* * * * *